(12) United States Patent
Kim et al.

(10) Patent No.: US 9,583,638 B2
(45) Date of Patent: Feb. 28, 2017

(54) TRANSISTORS, METHODS OF MANUFACTURING A TRANSISTOR AND ELECTRONIC DEVICES INCLUDING A TRANSISTOR

(75) Inventors: Sun-il Kim, Osan-si (KR); Sang-wook Kim, Yongin-si (KR); Jae-chul Park, Suwon-si (KR); Chang-jung Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 465 days.

(21) Appl. No.: 12/923,241

(22) Filed: Sep. 10, 2010

(65) Prior Publication Data
US 2011/0108835 A1 May 12, 2011

(30) Foreign Application Priority Data
Nov. 9, 2009 (KR) .......................... 10-2009-0107517

(51) Int. Cl.
*H01L 29/10* (2006.01)
*H01L 29/786* (2006.01)

(52) U.S. Cl.
CPC .... *H01L 29/78696* (2013.01); *H01L 29/7869* (2013.01)

(58) Field of Classification Search
CPC .................. H01L 29/7869; H01L 29/78696
USPC ................. 257/43, E29.117, E29.277
See application file for complete search history.

(56) References Cited

U.S. PATENT DOCUMENTS

| 7,884,360 B2 * | 2/2011 | Takechi et al. ................. 257/57 |
| 8,053,836 B2 * | 11/2011 | Yeh et al. ..................... 257/345 |
| 2003/0047785 A1 * | 3/2003 | Kawasaki et al. ............ 257/350 |
| 2008/0206923 A1 * | 8/2008 | Kim et al. .................... 438/104 |
| 2008/0277658 A1 * | 11/2008 | Lee et al. ....................... 257/43 |
| 2009/0072232 A1 | 3/2009 | Hayashi et al. |
| 2009/0261325 A1 * | 10/2009 | Kawamura et al. ............ 257/43 |
| 2009/0321731 A1 * | 12/2009 | Jeong et al. .................... 257/43 |
| 2010/0314618 A1 * | 12/2010 | Tanaka et al. .................. 257/43 |

FOREIGN PATENT DOCUMENTS

| JP | 2008-42088 | 2/2008 |
| JP | 2008-243928 | 10/2008 |
| JP | 2009-21554 | 1/2009 |
| KR | 10-2003-0022692 | 3/2003 |
| KR | 10-2007-0090182 | 9/2007 |
| KR | 10-2008-0076608 | 8/2008 |

(Continued)

OTHER PUBLICATIONS

Barquinha et al., "Gallium-Indium-Zinc-Oxide-Based Thin-Film Transistors: Influence of the Source/Drain Material", IEEE Transactions on Electron Devices 55 (2008) pp. 954-960.*

(Continued)

*Primary Examiner* — Jay C Kim
(74) *Attorney, Agent, or Firm* — Harness, Dickey & Pierce, P.L.C.

(57) ABSTRACT

A transistor, a method of manufacturing a transistor, and an electronic device including a transistor are provided, the transistor may include a channel layer having a multi-layer structure. The channel layer may have a double layer structure or a triple layer structure. At least two layers of the channel layer may have different oxygen concentrations.

14 Claims, 11 Drawing Sheets

(56) References Cited

FOREIGN PATENT DOCUMENTS

KR         10-0858821  B1      9/2008

OTHER PUBLICATIONS

Kim et al., "Inkjet-printed InGaZnO thin film transistor", Thin Solid Films 517 (2009) pp. 4007-4010.*
Na et al., "High field-effect mobility amorphous InGaZnO transistors with aluminum electrodes", Applied Physics Letters 93 (2008) 063501.*
Korean Office Action corresponding to Korean Application No. 10-2009-0107517 mailed on Jul. 29, 2015, and English translation thereof.

* cited by examiner

TRANSISTORS, METHODS OF MANUFACTURING A TRANSISTOR AND ELECTRONIC DEVICES INCLUDING A TRANSISTOR

CROSS-REFERENCE TO RELATED APPLICATIONS

This application claims the benefit of priority under 35 U.S.C. §119 from Korean Patent Application No. 10-2009-0107517, filed on Nov. 9, 2009, in the Korean Intellectual Property Office, the disclosure of which is incorporated herein in its entirety by reference.

BACKGROUND

1. Field

Example embodiments relate to transistors, methods of manufacturing a transistor, and electronic devices including a transistor.

2. Description of the Related Art

Transistors are used as switching devices, or driving devices, in electronic devices. In particular, because thin film transistors may be formed on glass substrates or plastic substrates, they are generally used in the field of flat panel display devices (e.g., liquid crystal display devices and organic light emitting display devices).

A method of using an oxide layer having a high carrier mobility as a channel layer is used to increase the operational characteristics of a transistor. This method is mostly applied to a thin film transistor for a flat panel display device.

However, the characteristics of a transistor having an oxide layer as a channel layer may not be constantly (or consistently) maintained because the oxide layer is sensitive to light.

SUMMARY

Example embodiments relate to transistors, methods of manufacturing a transistor and electronic devices including a transistor.

Example embodiments include transistors of which characteristic variations due to light are suppressed. Example embodiments include methods of manufacturing the transistors. Example embodiments include electronic devices including the transistors.

Additional embodiments will be set forth in part in the description which follows and, in part, will be apparent from the description, or may be learned by practice of the presented embodiments.

According to example embodiments, a transistor includes a channel layer having a multi-layer structure, a source electrode and a drain electrode separately contacting two ends of the channel layer, a gate corresponding to the channel layer, and a gate insulating layer interposed between the channel layer and the gate. The channel layer includes a first layer, a second layer and a third layer that are sequentially arranged from the side of the gate. The second layer has a different oxygen concentration from those of the first and third layers.

The oxygen concentration of the second layer may be higher than those of the first and third layers. The oxygen concentration of the second layer may be about 50 at % to about 90 at %. The oxygen concentration of at least one of the first and third layers may be about 40 at % to about 50 at %.

The channel layer may be an oxide layer. At least one of the first layer, the second layer and the third layers may include a ZnO-based oxide. The ZnO-based oxide may include at least one element selected from the group consisting of indium (In), gallium (Ga), tin (Sn), titanium (Ti), zirconium (Zr), hafnium (Hf), yttrium (Y), tantalum (Ta), chromium (Cr) and combinations thereof.

The first layer may have a thickness of about 2-nm to about 30-nm. The second layer may have a thickness of about 2-nm to about 30-nm. The third layer may have a thickness of about 30-nm to about 100-nm.

The gate may be disposed under the channel layer. The source electrode and the drain electrode may contact an upper surface of the channel layer.

The transistor may have a top gate structure in which the gate is disposed above the channel layer. The source electrode and the electrode drain may contact a lower surface of the channel layer.

According to example embodiments, a flat panel display device includes the above-described transistor. The flat panel display device may be a liquid crystal display or an organic light emitting display device.

According to example embodiments, a transistor includes a channel layer having a multi-layer structure, a source electrode and a drain electrode separately contacting two ends of the channel layer, a gate corresponding to the channel layer, and a gate insulating layer interposed between the channel layer and the gate. The channel layer includes a first layer and a second layer. The first layer is disposed nearer to the gate than the second layer. An oxygen concentration of the first layer is higher than an oxygen concentration of the second layer.

At least one of the first layer and the second layer may include a zinc oxide ZnO-based oxide. The ZnO-based oxide may include at least one element selected from the group consisting of In, Ga, Sn, Ti, Zr, Hf, Y, Ta, Cr and combinations thereof.

The oxygen concentration of the first layer may be about 50 at % to about 90 at %. The oxygen concentration of the second layer may be about 40 at % to about 50 at %.

The first layer may have a thickness of about 2-nm to about 30-nm. The second layer may have a thickness of about 30-nm to about 100-nm.

The transistor may have a bottom gate structure in which the gate is disposed under the channel layer, and the source electrode and the drain electrode may contact an upper surface of the channel layer.

The transistor may have a top gate structure in which the gate is disposed above the channel layer, and the source electrode and the drain electrode may contact a lower surface of the channel layer.

According to example embodiments, a flat panel display device includes the above-described transistor. The flat panel display device may be a liquid crystal display, or an organic light emitting display device.

The transistor may be used as a switching device or a driving device.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
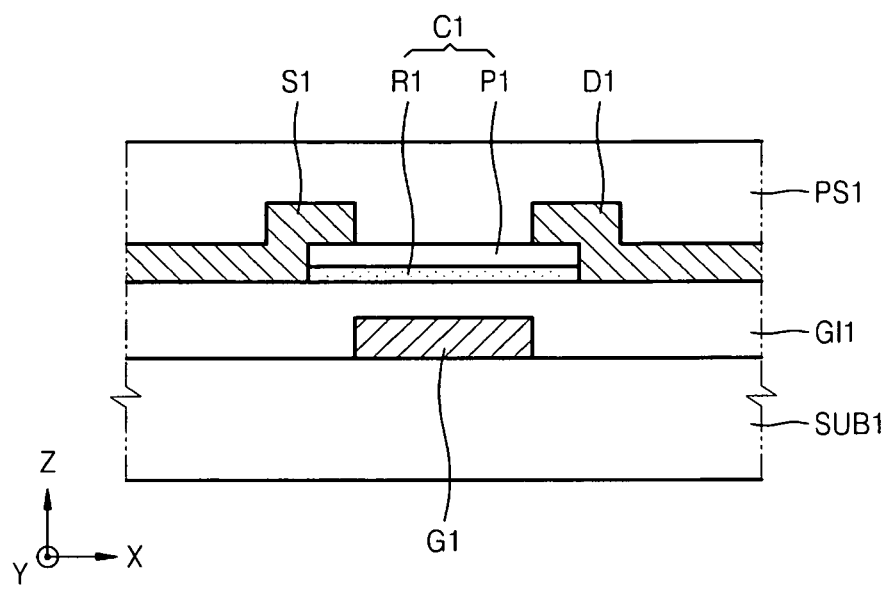
FIGS. 1 through 4 are cross-sectional views illustrating a transistor according to example embodiments.

Various embodiments will now be described more fully with reference to the accompanying drawings in which some embodiments are shown.

Detailed illustrative embodiments are disclosed herein. However, specific structural and functional details disclosed herein are merely representative for purposes of describing embodiments. This invention may, however, may be embodied in many alternate forms and should not be construed as limited to only the embodiments set forth herein.

Accordingly, while embodiments are capable of various modifications and alternative forms, embodiments thereof are shown by way of example in the drawings and will herein be described in detail. It should be understood, however, that there is no intent to limit embodiments to the particular forms disclosed, but on the contrary, embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," "connected to" or "coupled to" another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In the drawings, the thicknesses of layers and regions are exaggerated for clarity. Like reference numerals in the drawings denote like elements.

In order to more specifically describe example embodiments, various aspects will be described in detail with reference to the attached drawings. However, the present invention is not limited to example embodiments described.

Example embodiments relate to transistors, methods of manufacturing a transistor and electronic devices including a transistor.

FIG. 1 is a cross-sectional diagram of a transistor according to example embodiments.

Referring to FIG. 1, a transistor 100 has a bottom-gate structure in which a gate G1 is formed below a channel layer C1.

The gate G1 may be formed on a substrate SUB1. The substrate SUB1 may be a glass substrate, or other substrates used in a general semiconductor device process. For example, the substrate SUB 1 may be a plastic substrate or a silicon substrate. The gate G1 may be formed of a general electrode material (e.g., a metal). A gate insulating layer GI1 may be formed on the substrate SUB1 to cover the gate G1. The gate insulating layer GI1 may be a silicon oxide layer, a silicon nitride layer or another material layer (e.g., a high-k dielectric layer having a higher dielectric constant than a silicon nitride layer).

A channel layer C1 may be formed on the gate insulating layer GI1. The channel layer C1 may be disposed above the gate G1. The width of the channel layer C1 in the x-axis direction may be relatively greater than the width of the gate G1 in the x-axis direction. The channel layer C1 may have a multi-layer structure that includes at least two oxide layers. For example, according to example embodiments, the channel layer C1 may have a double-layer structure including a first oxide layer R1 and a second oxide layer P1 that are sequentially stacked on the gate insulating layer GI1. The first oxide layer R1 is disposed nearer to the gate G1 than the second oxide layer P1. The first oxide layer R1 is interposed between the gate insulating layer GI1 and the second oxide layer P1. The first oxide layer R1 may contact the gate insulating layer GI1, and a source electrode S1 and a drain electrode D1 may contact an upper surface of the second oxide layer P1.

An oxygen concentration of the first oxide layer R1 may be higher than that of the second oxide layer P1. The first oxide layer R1 may be referred to as an oxygen-rich oxide layer, and the second oxide layer P1 may be referred to as an oxygen-poor oxide layer. The terms "oxygen-rich" and "oxygen-poor" used herein denote a layer having a substantially high oxygen concentration and a layer having a substantially low oxygen concentration among the two layers, the first and second oxide layers R1 and P1, respectively. The terms "oxygen-rich" and "oxygen-poor" may indicate the relative oxygen concentrations of the two layers rather than values of a stoichiometric composition. Hereinafter, the first oxide layer R1 is referred to as an oxygen-rich layer R1, and the second oxide layer P1 is referred to as an oxygen-poor layer P1. The oxygen-rich layer R1 may be a layer formed using a reaction gas having an oxygen content of about 30% or greater, and the oxygen-poor layer P1 may be a layer formed by using a reaction gas having an oxygen gas of about 20% or less. The reaction gas may be a mixture gas of oxygen and argon (Ar). The oxygen-rich layer R1 may be formed by using 100% oxygen gas as a reaction gas, instead of using argon (Ar). An oxygen concentration of the oxygen-rich layer R1 may be about 50 at % to about 90 at %, and that of the oxygen-poor layer P1 may be about 40 at % to about 50 at %.

The channel layer C1 (the oxygen-rich layer R1 and the oxygen-poor layer P1, collectively) may include an oxide semiconductor (e.g., a ZnO-based oxide semiconductor). When the channel layer C1 includes a ZnO-based oxide semiconductor, the ZnO-based oxide semiconductor of the channel layer C1 may include at least one element selected from the group consisting of a Group 13 element (e.g., indium (In) and gallium (Ga)), a Group 14 element (e.g., tin (Sn)), a Group 4 element (transition metal) (e.g., titanium (Ti), zirconium (Zr) and hafnium (Hf)), and other transition metals (e.g., yttrium (Y), tantalum (Ta) and chromium (Cr)).

The oxide semiconductor may be amorphous or crystalline, or a mixture of both amorphous and crystalline. For example, the oxygen-rich layer R1 and the oxygen-poor layer P1 according to example embodiments may be HfIn-ZnO layers having different oxygen concentrations. The metal ratio of the oxygen-rich layer R1 and the oxygen-poor layer P1 may be different or the same. The oxygen-rich layer R1 and the oxygen-poor layer P1 may be oxide layers of the same group, or may be different oxide layers depending on the application. The thickness of the oxygen-rich layer R1 may be about 2-nm to about 30-nm. The thickness of the oxygen-rich layer R1 may be about 4-nm to about 12-nm. The oxygen-poor layer P1 may be thicker than the oxygen-rich layer R1. For example, the oxygen-poor layer P1 may have a thickness of about 30-nm to about 100-nm.

In general, the characteristics of the transistor 100 may be determined by a portion of a channel layer C1 that is adjacent to a gate G1 (or a gate insulating layer GI1). In example embodiments, the oxygen-rich layer R1 is disposed nearer to the gate G1 than the oxygen-poor layer P1. Because the oxygen-rich layer R1 has a substantially small thickness, the oxygen-poor layer P1 may affect the characteristics of the transistor 100 (e.g., mobility and threshold voltage). Source and drain electrodes S1 and D1 contact the oxygen-poor layer P1 of the channel layer C1. As such, the effect of the oxygen-poor layer P1 on the characteristics of the transistor 100 may increase.

Due to a difference in the oxygen concentrations of the oxygen-rich layer R1 and the oxygen-poor layer P1, a carrier density of the oxygen-poor layer P1 may be higher than that of the oxygen-rich layer R1. This indicates that the oxygen-poor layer P1 may affect the characteristics of the transistor (e.g., mobility) more than the oxygen-rich layer R1. As described above, as the oxygen-poor layer P1 may affect the characteristics of the transistor 100, a desired mobility and threshold voltage of the transistor 100 may be obtained by the oxygen-poor layer P1. Meanwhile, the oxygen-rich layer R1 may suppress, or prevent, variations in the characteristics of the transistor 100 due to light. Defects that occur in a channel layer C1, and in an interface between the channel layer C1 and a gate insulating layer GI1, function as trap sites of charges. As such, the defects may be a factor causing variations in the characteristics of the transistor 100 due to light. According to example embodiments, the oxygen-rich layer R1 may reduce (or decrease) defects caused due to oxygen deficiency in the channel layer C1 and an interface between the channel layer C1 and the gate insulating layer GI1. It is assumed that because the generation of the trap site is suppressed by the oxygen-rich layer R1, variations in the characteristics of the transistor 100 due to traps of remaining charges generated in the channel layer C1 due to light are suppressed, or prevented. According to example embodiments, a transistor 100 having a desired mobility and threshold voltage may be obtained, and variations in the characteristics of the transistor 100 may be suppressed.

The source electrode S1 and the drain electrode D1 contacting two ends of the channel layer C1 may be formed on the gate insulating layer GI1. The source and drain electrodes S1 and D1 may be a single metal layer, or a multi-metal layer. The source and drain electrodes S1 and D1 may be formed of the same metal as the gate G1, or a different metal from the gate G1. A passivation layer PS1 may be formed on the gate insulating layer GI1 to cover the source and drain electrodes S1 and D1 and the channel layer C1. The passivation layer PS1 may be a silicon oxide layer, a silicon nitride layer, an organic layer, or a stack including at least two of these layers. The thicknesses of the gate G1, the gate insulating layer GI1, the source electrode S1, and the drain electrode D1 may be about 50-nm to about 300-nm, about 50-nm to about 400-nm, about 10-nm to about 200-nm, and about 10-nm to about 200-nm, respectively.

Figure 2:
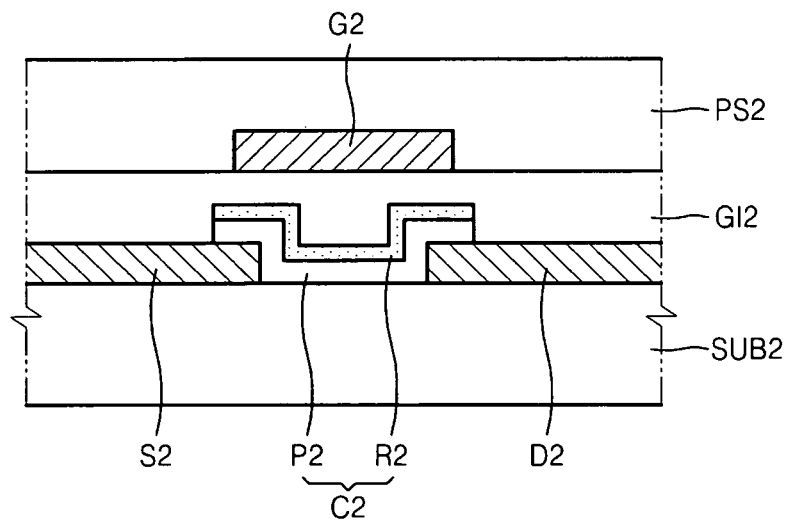

FIG. 2 illustrates a transistor according to example embodiments.

Referring to FIG. 2, a transistor 200 has a top-gate structure in which a gate G2 is disposed over a channel layer C2.

A source electrode S2 and a drain electrode D2 may be formed on a substrate SUB2 separately from each other. The channel layer C2 may contact ends of the source electrode S2 and the drain electrode D2. A lower surface of both (or opposing) ends of the channel layer C2 may respectively contact the source electrode S2 and the drain electrode D2. The channel layer C2 may have a multi-layer structure including at least two oxide layers. For example, in example embodiments, the channel layer C2 may have a double-layer structure in which a second oxide layer P2 and a first oxide layer R2 are sequentially stacked. The second oxide layer P2 may be formed of the same material as the oxygen-poor layer P1 of the FIG. 1, and the first oxide layer R2 may be formed of the same material as the oxygen-rich layer R1 of FIG. 1. Hereinafter, the second oxide layer P2 is referred to as an oxygen-poor layer P2, and the first oxide layer R2 is referred to as an oxygen-rich layer R2. The channel layer C2 has a structure similar to the upside-down structure (i.e., inverted structure) of the channel layer C1 of FIG. 1. A gate insulating layer GI2 covering the channel layer C2, the source electrode S2 and the drain electrode D2 may be formed on the substrate SUB2. The oxygen-rich layer R2 contacts the gate insulating layer GI2, and the oxygen-poor layer P2 contacts the source electrode S2 and the drain electrode D2. This is similar to the transistor 100 of FIG. 1 in that the oxygen-rich layer R1 contacts the gate insulating layer GI1 and the oxygen-poor layer P1 contacts the source electrode S1 and the drain electrode D1. The gate G2 may be formed on the gate insulating layer GI2. The gate G2 may be disposed above the channel layer C2. A passivation layer PS2, covering the gate G2, may be formed on the gate insulating layer GI2. The materials and thicknesses of the substrate SUB2, the source electrode S2, the drain electrode D2, the oxygen-poor layer P2, the oxygen-rich layer R2, the gate insulating layer GI2, the gate G2, and the passivation layer PS2 illustrated in FIG. 2 may be the same as those of the substrate SUB1, the source electrode S1, the drain electrode D1, the oxygen-poor layer P1, the oxygen-rich layer R1, the gate insulating layer GI1, the gate G1, and the passivation layer PS1 of FIG. 1, respectively. According to example embodiments, in the transistor 200 shown in FIG. 2, a desired mobility and threshold voltage of the transistor 200 may be obtained with the oxygen-poor layer P2, and variations in the characteristics of the transistor 200 due to light may be suppressed by using the oxygen-rich layer R2.

Figure 3:
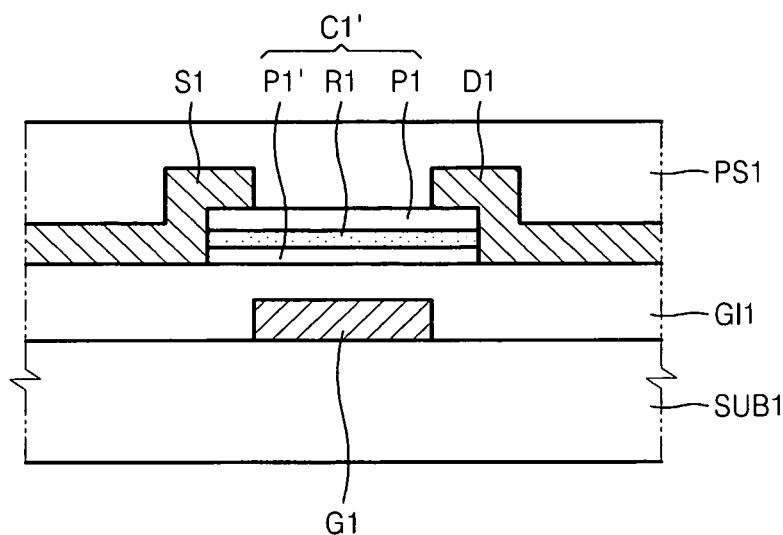

FIG. 3 illustrates a transistor according to example embodiments.

Referring to FIG. 3, a transistor 300 has a similar structure as the transistor 100 shown in FIG. 1 except that a third oxide layer P1' is disposed between the gate insulating layer GI1 and the oxygen-rich layer R1. The third oxide layer P1', the oxygen-rich layer R1 and the oxygen-poor layer P1 may be referred to as a lower layer, an intermediate layer and an upper layer, respectively. The third oxide layer P1', which is the lower layer, is disposed nearest to the gate G1. A source electrode S1 and a drain electrode D1 contact two (or opposing) ends of the upper surface of the oxygen-poor layer P1, which is the upper layer.

The third oxide layer P1' may have a lower oxygen concentration than the oxygen-rich layer R1. For example, the third oxide layer P1' may be formed of the same material as the oxygen-poor layer P1, or a similar material to that of the oxygen-poor layer P1. The third oxide layer P1' may be deposited by using a reaction gas having an oxygen content of 20% or less similar to the oxygen-poor layer P1. The reaction gas may be a mixture gas of oxygen and argon (Ar). Hereinafter, the third oxide layer P1' is referred to as a first oxygen-poor layer P1', and the oxygen-poor layer P1 is referred to as a second oxygen-poor layer P1. A channel layer C1' has a multi-layer structure in which the oxygen-rich layer R1 is interposed between two oxygen-poor layers (the first and second oxygen-poor layers P1' and P1). The oxygen-rich layer R1 and the first and second oxygen-poor layers P1' and P1 may include an oxide semiconductor, for example, a ZnO-based oxide semiconductor. In this case, the ZnO-based oxide semiconductor may include at least one element selected from the group consisting of a Group 13 element (e.g., In and Ga), a Group 14 element (e.g., Sn), a Group 4 element (transition metal) (e.g., Ti, Zr, and Hf), and other transition metals (e.g., Y, Ta, and Cr). The oxygen-rich layer R1 and the first and second oxygen-poor layers P1' and P1 may be formed of oxide layers of the same group, or different oxide layers depending on the application. The thickness of the first oxygen-poor layer P1' may be about 2-nm to about 30-nm.

In the transistor 300, the first oxygen-poor layer P1' is interposed between the gate insulating layer GI1 and the oxygen-rich layer R1. The first oxygen-poor layer P1' contacts the gate insulating layer GI1. Compared to the oxygen-rich layer R1 and the second oxygen-poor layer P1, the first oxygen-poor layer P1' is disposed nearest to the gate G1. Due to the first oxygen-poor layer P1' that contacts the gate insulating layer GI1, in the channel layer C1', the first oxygen-poor layer P1' having a substantially high carrier density affects the characteristics of the transistor 300 (e.g., mobility). As the source and drain electrodes S1 and D1 contact the upper surface of the second oxygen-poor layer P1, the second oxygen-poor layer P1 may affect the characteristics of the transistor 300 (e.g., mobility). The characteristics of the transistor illustrated in FIG. 3 may be determined by the first and second oxygen-poor layers P1' and P1, which have a substantially high carrier density. In this respect, the characteristics (e.g., mobility) of the transistor 300, including the first oxygen-poor layer P1' may be increased compared to than those (e.g., mobility) of the transistor 100 shown in FIG. 1. In the transistor of FIG. 3, the oxygen-rich layer R1 is separated a set distance apart from an interface between the gate insulating layer GI1 and the channel layer C1' but may still suppress, or decrease, variations in the characteristics of the transistor 300 due to light. Suppression of the variations is likely due to reduction in trap sites in the channel layer C1' by the oxygen-rich layer R1. By using the channel layer C1' having a triple-layer structure as illustrated in FIG. 3, it is possible to make an oxide transistor of which characteristics variations due to light are suppressed and/or exhibit increased characteristics.

According to example embodiments, the effects due to the first oxygen-poor layer P1' may be related to the thickness thereof. As described above, the thickness of the first oxygen-poor layer P1' may be about 2-nm to about 30-nm. If the thickness of the first oxygen-poor layer P1' is less than about 2-nm, the mobility increasing effect due to the first oxygen-poor layer P1' may decrease. If the thickness of the first oxygen-poor layer P1' is over about 30-nm, the light stability increasing effect may not be sufficient as the oxygen-rich layer R1 farther from the gate insulating layer GI1.

Figure 4:
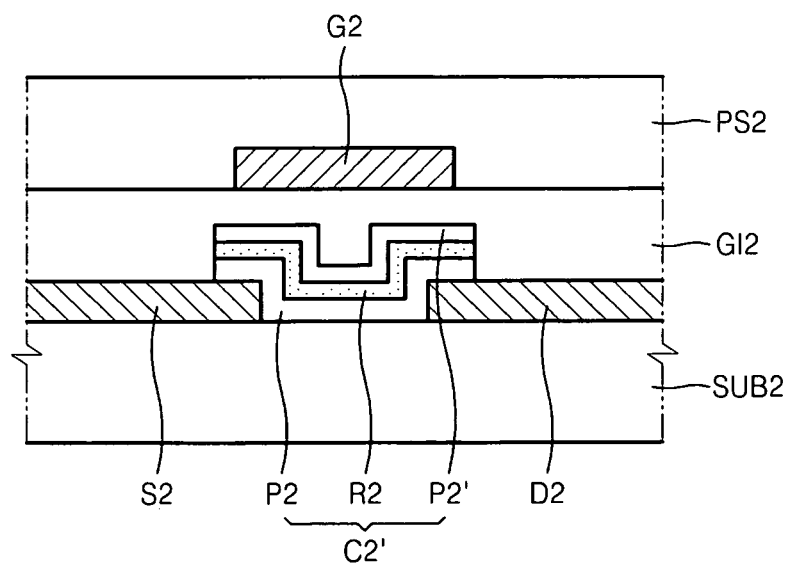

FIG. 4 illustrates a transistor according to example embodiments.

The transistor 400 shown in FIG. 4 has a similar structure as the transistor 200 of FIG. 2 except that a third oxide layer P2' is interposed between a gate insulating layer GI2 and an oxygen-rich layer R2.

Referring to FIG. 4, a oxygen-poor layer P2, the oxygen-rich layer R2, and the third oxide layer P2' may be referred to as a lower layer, an intermediate layer, and an upper layer of the channel layer C2', respectively. The third oxide layer P2', which is the upper layer, is disposed nearest to the gate G2, compared to the oxygen-rich layer R2 and the oxygen-poor layer P2. A source electrode S2 and a drain electrode D2 contact two (or opposing) ends of a lower surface of the oxygen-poor layer P2, which is the lower surface.

The third oxide layer P2' may have a lower oxygen concentration than the oxygen-rich layer R2. For example, the third oxide layer P2' may be formed of the same material as the oxygen-poor layer P2 or a material similar to that of the oxygen-poor layer P2. Hereinafter, the third oxide layer P2' is referred to as a first oxygen-poor layer P2', and the oxygen-poor layer P2 is referred to as a second oxygen-poor layer P2. The first oxygen-poor layer P2', the second oxygen-poor layer P2, and the oxygen-rich layer R2 may be formed of the same materials and have the same thicknesses as the first oxygen-poor layer P1', the second oxygen-poor layer P1, and the oxygen-rich layer R1 of FIG. 3, respectively. The channel layer C2' has a structure similar to the upside-down structure (i.e., inverted structure) of the channel layer C1' of FIG. 3.

Figure 5:
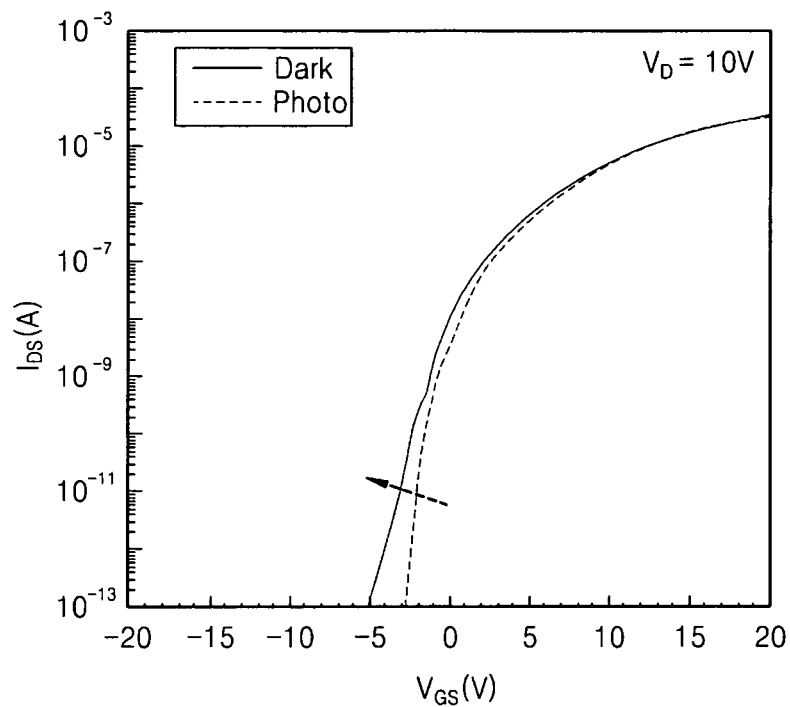
FIG. 5 is a graph showing variations, due to light irradiation, in gate voltage ($V_{GS}$) and drain current ($I_{DS}$) characteristics of a transistor according to a comparative example.

FIG. 5 is a graph showing variations in gate voltage ($V_{GS}$) and drain current (Ips) characteristics of a transistor according to a comparative example due to light irradiation. The transistor according to the comparative example has a similar structure as the transistor 100 shown in FIG. 1 except that a HfInZnO single layer (having thickness of about 50-nm) is used as a channel layer. When depositing the HfInZnO single layer, an oxygen content of reaction gas ($[O_2/(Ar+O_2)]\times 100$) was about 10%. Accordingly, the HfInZnO single layer is considered an "oxygen-poor oxide layer." In FIG. 5, 'Dark' denotes a case in which light is not irradiated, and 'Photo' denotes a case in which light of about 20000 nit is irradiated. These denotations are also used in FIG. 6.

Referring to FIG. 5, when light is irradiated, a plotted line is shifted to the left of the graph. That is, the characteristics of the transistor vary due to the irradiated light. A threshold voltage of the transistor moves in a negative (−) direction, and a subthreshold swing voltage of the transistor is increased.

Figure 6:
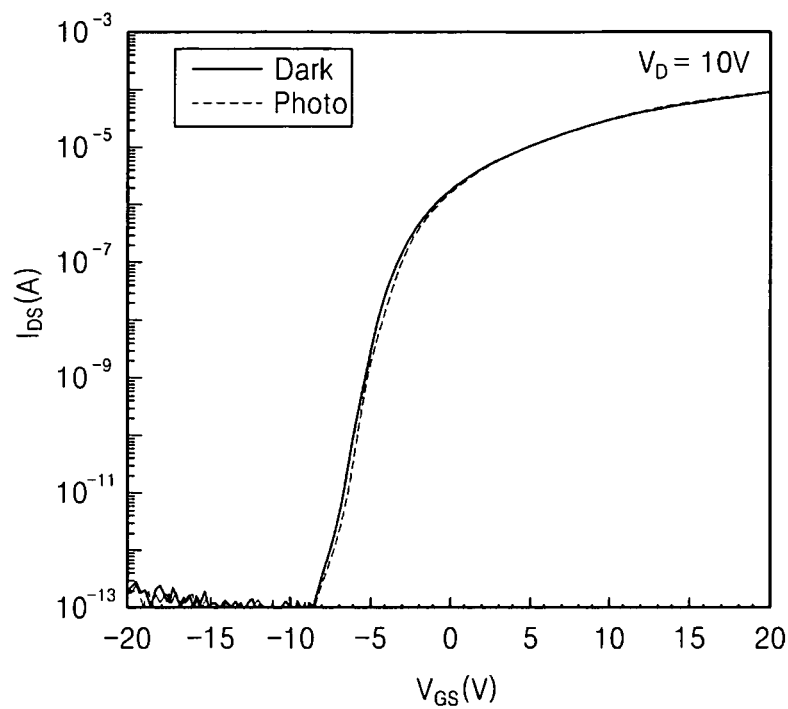
FIG. 6 is a graph showing variations due to light irradiation in gate voltage ($V_{GS}$) and drain current ($I_{DS}$) characteristics of a transistor according to example embodiments.

FIG. 6 is a graph showing variations in gate voltage ($V_{GS}$) and drain current ($I_{DS}$) characteristics of a transistor according to example embodiments due to light irradiation.

The transistor used to obtain the results shown in FIG. 6 has the structure of the transistor 100 of FIG. 1. An oxygen-rich HfInZnO layer was used as the oxygen-rich layer R1 of the channel layer C1, and an oxygen-poor HfInZnO layer was used as the oxygen-poor layer P1. When forming the oxygen-rich HfInZnO layer, an oxygen content of reaction gas ($[O_2/(Ar+O_2)]\times 100$) was 100%, and when forming an oxygen-poor HfInZnO layer, an oxygen content of reaction gas ($[O_2/(Ar+O_2)]\times 100$) was 10%. The thickness of the oxygen-rich HfInZnO layer is about 10-nm, and the thickness of the oxygen-poor HfInZnO layer is about 50-nm.

Referring to FIG. 6, the plotted lines of the graph are almost the same in a case where light is irradiated and in a case where light is not irradiated. This indicates that the characteristics of the transistor hardly vary due to light.

As can be seen from the results of FIGS. 5 and 6, when a multi-layered channel layer including the "oxygen-rich layer" according to example embodiments is used, variations in the characteristics of the transistor due to light are suppressed, or minimized. Despite using the "oxygen-rich layer", a decrease in the mobility of the transistor was not observed.

Figure 7:
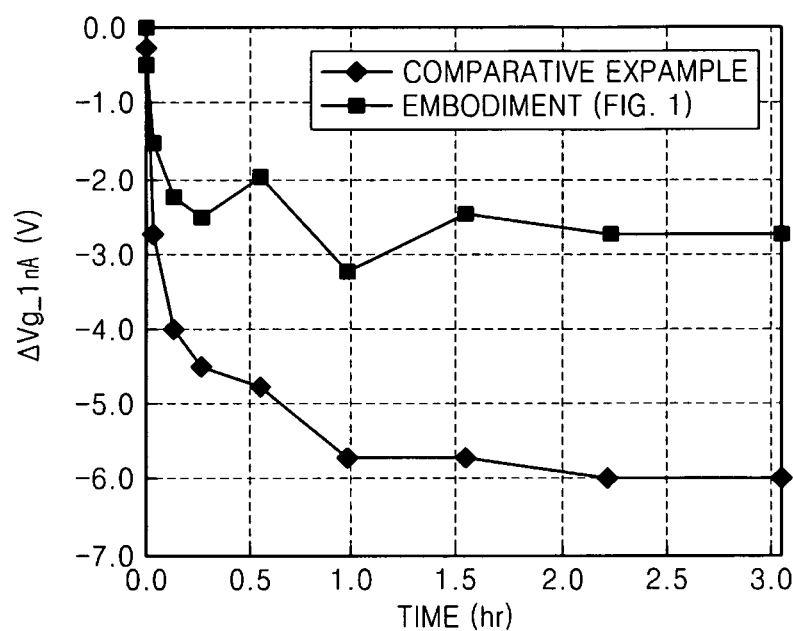
FIG. 7 is a graph showing variations, due to light radiation and a voltage stress, in the characteristics of the transistors according to example embodiments and a comparative example.

FIG. 7 is a graph showing variations in the characteristics of a transistor according to example embodiments and a comparative example due to light radiation and a voltage stress.

The transistor according to example embodiments has the same structure of the transistor from which the results of FIG. 6 are obtained (the structure of the transistor of FIG. 1). An oxygen-rich HfInZnO layer is formed to have a thickness of about 12-nm by using a reaction gas having an oxygen content ($[O_2/(Ar+O_2)]\times 100$) of about 50%, and an oxygen-poor HfInZnO layer is formed to have a thickness of about 45-nm by using a reaction gas having an oxygen content ($[O_2/(Ar+O_2)]\times 100$) of about 10%. The transistor according to the comparative example is the same as the transistor with which the results of FIG. 5 are obtained. The characteristics ("ΔVg_1 nA") of the transistors are measured according to time by irradiating light of about 20000 nit to the transistor according to example embodiments and that of the comparative example while respectively applying a voltage of −20V, 10V, and 0 V, to the gate, the drain, and the source. "ΔVg_1 nA" represents a difference in 'Vg_1 nA' between before and after irradiating light ([Vg_1 nA(after)−Vg_1 nA(before)]). 'Vg_1 nA' denotes a gate voltage for allowing a current of 1 nA to flow between the source and the drain. When measuring 'Vg_1 nA', voltages of 10 V and 0 V are applied to the drain and the source, respectively.

Referring to FIG. 7, in the transistor according to the comparative example, when about 0.5 hours pass after irradiating light under a voltage stress, ΔVg_1 nA is reduced to about −5.0 V. After about 1 hour, ΔVg_1 nA is reduced to about −6.0 V. This indicates that a threshold voltage is varied to about 5.0 V about 0.5 hours later and to about 6.0 V about 1 hour later, after irradiating light under a voltage stress in the transistor according to the comparative example. In the transistor according to example embodiments, variation in Vg_1 nA is relatively small. This means that variation in the threshold voltage due to light irradiation under a voltage stress is small in the transistor according to example embodiments.

Figure 8:
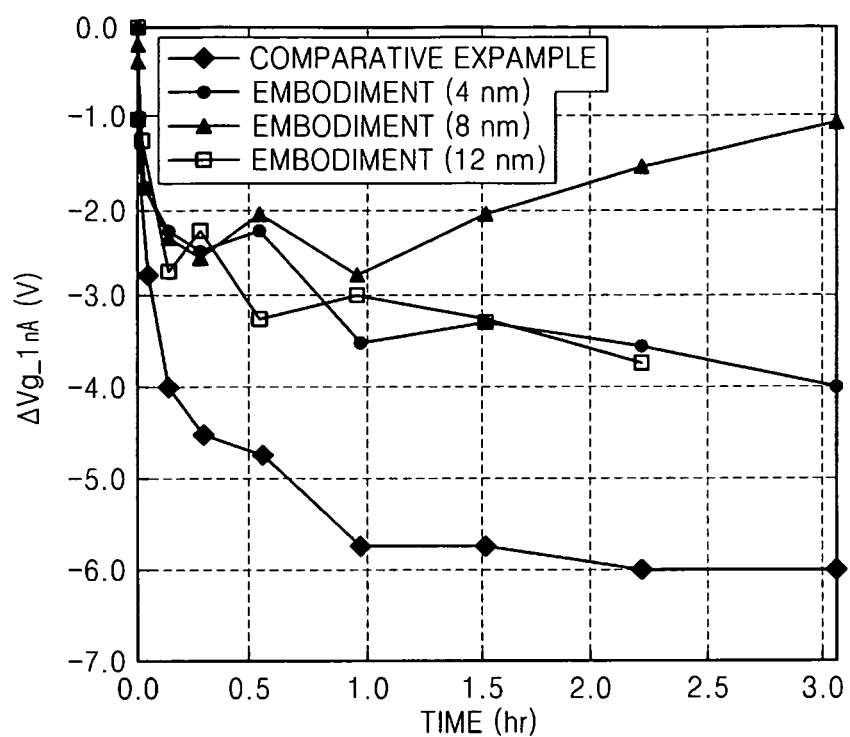
FIG. 8 is a graph showing variations, due to light radiation and a voltage stress according to the thickness of an oxygen-rich oxide layer, in the characteristics of a transistor according to example embodiments.

FIG. 8 is a graph showing variations in the characteristics of a transistor according to example embodiments due to light irradiation and a voltage stress according to the thickness of an oxygen-rich oxide layer.

The transistor used to obtain the results shown in FIG. 8 has the same structure as the transistor from which the results of FIG. 6 are obtained (the structure of FIG. 1). While varying the thickness of the oxygen-rich oxide layer (HfInZnO layer) (100% oxygen gas is used in deposition) to 4-nm, 8-nm, and 12-nm, variations in the characteristics ("ΔVg_1 nA") of the transistors are measured. In FIG. 8, the results of the comparative example of FIG. 7 are also shown.

Referring to FIG. 8, when the thicknesses of the oxygen-rich HfInZnO layer of the transistors are 4-nm, 8-nm, and 12-nm, respectively, variations in the characteristics of the transistor Vg_1 nA are less than those of the transistor of the comparative example. This indicates that the photoelectric reliability may be increased when the thickness of the oxygen-rich HfInZnO layer is at least in a range of 4-nm to 12-nm. FIG. 8 shows results of the transistor that includes an oxygen-rich HfInZnO layer formed using a reaction gas having a 100% oxygen content. If the oxygen content varies during deposition, the range of the thickness of the oxygen-rich HfInZnO layer showing an increase in the photoelectric reliability may vary. In addition, the range of the thickness of the oxygen-rich HfInZnO layer may vary according to the material of the oxygen-rich oxide layer. The range of the thickness of the oxygen-rich oxide layer (the oxygen-rich layer R1 of FIG. 1) is not limited to the range from about 4-nm to about 12-nm, but the oxygen-rich layer R1 may have a thickness of about 2-nm to about 30-nm as described above.

Figure 9:
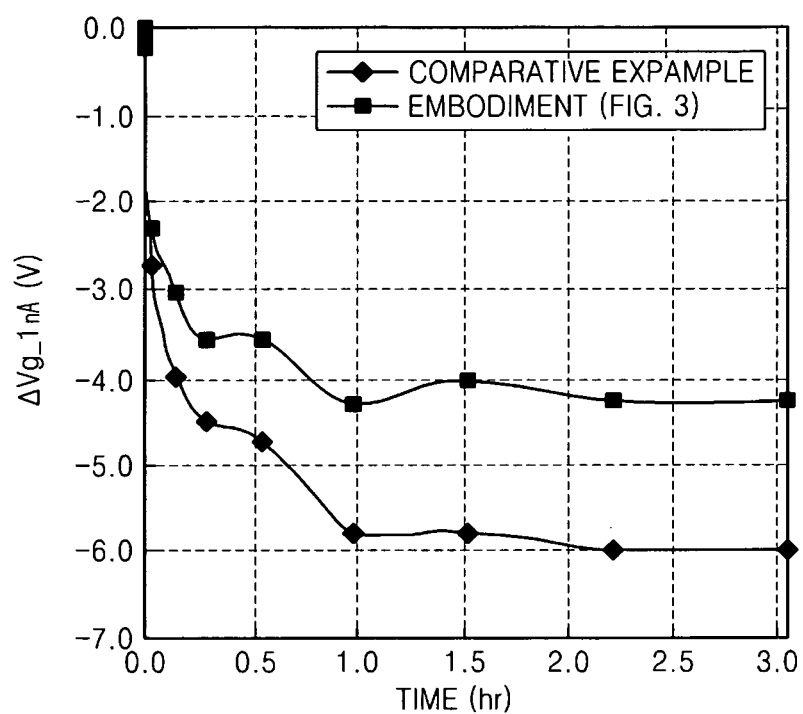
FIG. 9 is a graph showing variations due to light radiation and a voltage stress in the characteristics of a transistor according to example embodiments and a comparative example.

FIG. 9 is a graph showing variations in the characteristics ("ΔVg_1 nA") of transistors according to example embodiments and a comparative example due to light irradiation and a voltage stress.

The transistor according to example embodiments has the same structure as the transistor of FIG. 3 (an oxygen-rich HfInZnO layer is used as an oxygen-rich layer R1, and an oxygen-poor HfInZnO layer is used as oxygen-poor layers P1' and P1). When forming the oxygen-rich HfInZnO layer, an oxygen content of reaction gas was about 100%, and when forming the oxygen-poor HfInZnO layer, an oxygen content of reaction gas was about 10%. The thickness of the oxygen-rich HfInZnO layer was about 10-nm. The transistor of the comparative example was the same as the transistor from which the results of FIG. 5 were obtained.

Referring to FIG. 9, variations in the characteristics of the transistor according to example embodiments were less than those of the transistor of the comparative example under a voltage stress due to light irradiation. The results of FIG. 9 are similar to those of FIG. 7 or FIG. 8. Even when the channel layers C1' and C2' having a triple-layer structure as illustrated in FIG. 3 or FIG. 4 are used, the effects of increasing photoelectric reliability are obtained.

Hereinafter, a method of manufacturing a transistor according to example embodiments will be described.

FIGS. 10A through 10D are cross-sectional views illustrating a method of manufacturing a transistor according to example embodiments. According to example embodiments, a bottom-gate thin film transistor is manufactured. However, example embodiments are not limited thereto. In FIG. 1 and FIGS. 10A through 10D, like reference numerals denote like elements.

Figure 10A:
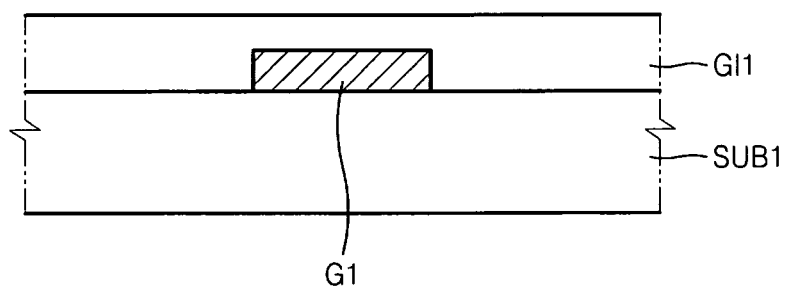
FIGS. 10A through 10D are cross-sectional views illustrating a method of manufacturing a transistor according to example embodiments.

Referring to FIG. 10A, a gate G1 may be formed on a substrate SUB1, and a gate insulating layer GI1 covering the gate G1 may be formed on the substrate SUB1. The gate insulating layer GI1 may be formed of a silicon oxide or a silicon nitride. The gate insulating layer GI1 may be formed of other materials (e.g., a high-k dielectric material having a higher dielectric constant than a silicon nitride).

Figure 10B:
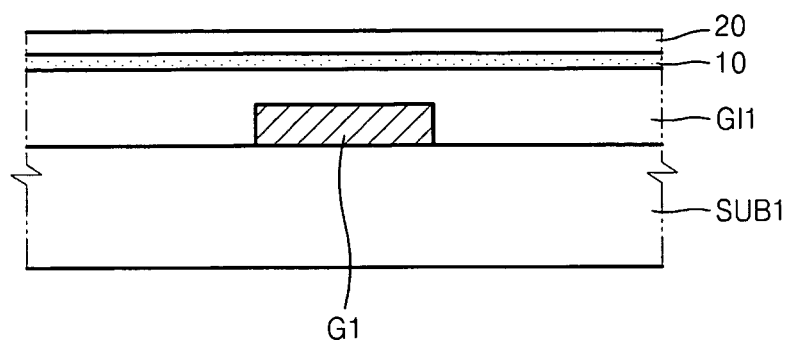

Referring to FIG. 10B, an oxide thin film for forming a channel having a multi-layer structure may be formed on the gate insulating layer GI1. For example, a first oxide layer 10 and a second oxide layer 20 may be sequentially formed. The first and second oxide layers 10 and 20 may be deposited by using a physical vapor deposition (PVD) (e.g., a sputtering method or an evaporation method). The first and second oxide layers 10 and 20 may be formed of oxide semiconductors having different oxygen concentrations. An oxygen concentration of the first oxide layer 10 may be higher than that of the second oxide layer 20. For example, an oxide semiconductor for forming the first and second oxide layers 10 and 20 may include a ZnO-based oxide semiconductor. In this case, the ZnO-based oxide semiconductor may include at least one element selected from the group consisting of a Group 13 element (e.g., In and Ga), a Group 14 element (e.g., Sn), a Group 4 element (transition metal) (e.g., Ti, Zr, and Hf), other transition metals (e.g. Y, Ta, and Cr) and combinations thereof. The oxygen concentrations of the first oxide layer 10 and the second oxide layer 20 may be adjusted by a flow ratio of argon (Ar) gas and oxygen ($O_2$) gas. When depositing the first oxide layer 10, an oxygen content of reaction gas ([$O_2$/(Ar+$O_2$)]×100) may be about 30% or more. When depositing the second oxide layer 20, an oxygen content of reaction gas may be about 20% or less. The thicknesses of the first and second oxide layers 10 and 20 may be about 2-nm to about 30-nm and about 30-nm to about 100-nm, respectively. When the first and second oxide layers 10 and 20 are formed of the same base material, the first and second oxide layers 10 and 20 may be formed in-situ. Depending on the application, base materials of the first and second oxide layers 10 and 20 may be different, and at least one of the first and second oxide layers 10 and 20 may be replaced with a non-oxide layer (or a layer not having oxygen).

Figure 10C:
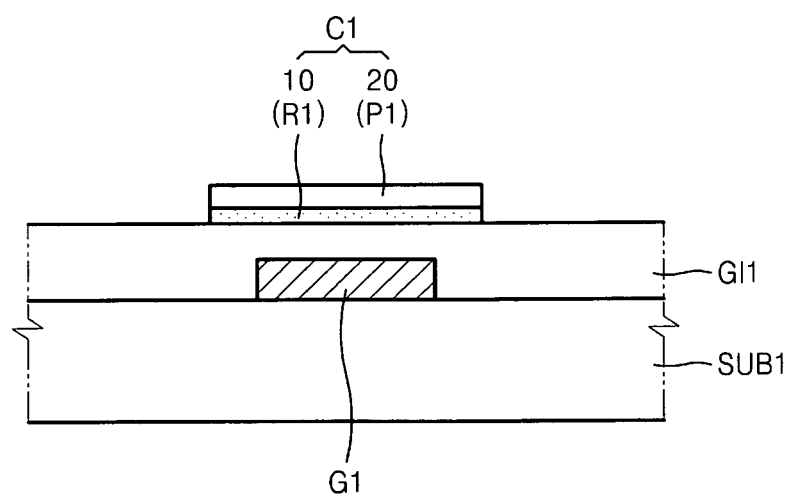

A channel layer C1 as illustrated in FIG. 10C may be formed by patterning the first and second oxide layers 10 and 20. The patterned first oxide layer 10 may be the same as the oxygen-rich layer R1 of FIG. 1, and the patterned second oxide layer 20 may be the same as the oxygen-poor layer P1. Hereinafter, the patterned first oxide layer 10 and the patterned second oxide layer 20 are referred to as an oxygen-rich layer R1 and an oxygen-poor layer P1, respectively.

Figure 10D:
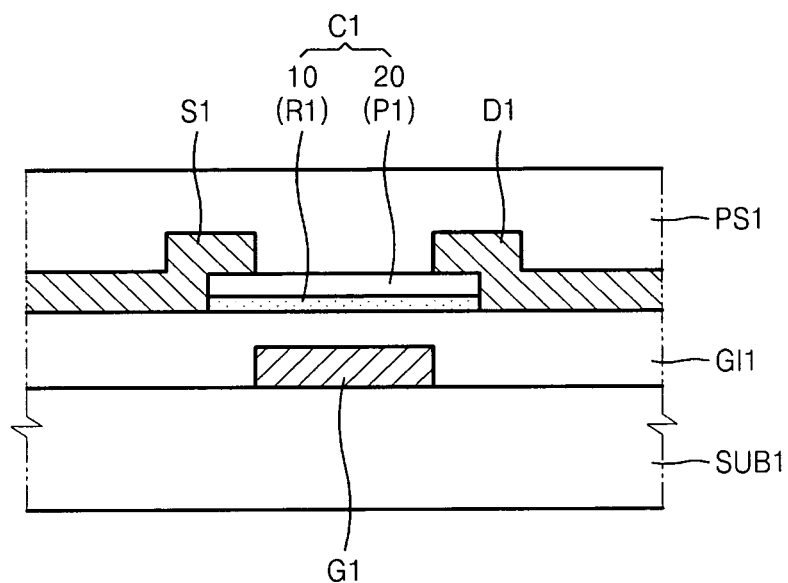

Referring to FIG. 10D, a source electrode S1 and a drain electrode D1 that contact two (or opposing) ends of the channel layer C1 and expose a portion of an upper surface of the channel layer C1 may be formed on the gate insulating layer GI1, respectively. The source and drain electrodes S1 and D1 may be formed as a single metal layer or a multi-metal layer. A passivation layer PS1 may be formed on the substrate SUB1 to cover the exposed portion of the channel layer C1 and the source and drain electrodes S1 and D1. The passivation layer PS1 may be formed to have a monolayer, or multi-layer, structure including at least one of a silicon oxide layer, a silicon nitride layer and an organic layer. The transistor described above may be annealed at a given temperature.

A transistor having the structure of the transistor of FIG. 3 may be obtained by modifying the method described above with reference to FIGS. 10A through 10D. In the operation described with reference to FIG. 10B, a first oxygen-poor oxide layer, an oxygen-rich oxide layer and a second oxygen-poor oxide layer are sequentially stacked on gate insulating layer GI1, and then patterned to obtain a structure of the channel layer C1' of FIG. 3. After subsequent operations, the transistor having the structure of the transistor of FIG. 3 may be obtained.

FIGS. 11A through 11D are cross-sectional views illustrating a method of manufacturing a transistor according to example embodiments.

In example embodiments, a top-gate thin film transistor is manufactured. However, example embodiments are not limited thereto. In FIG. 2 and FIGS. 11A through 11D, like reference numerals denote like elements.

Figure 11A:
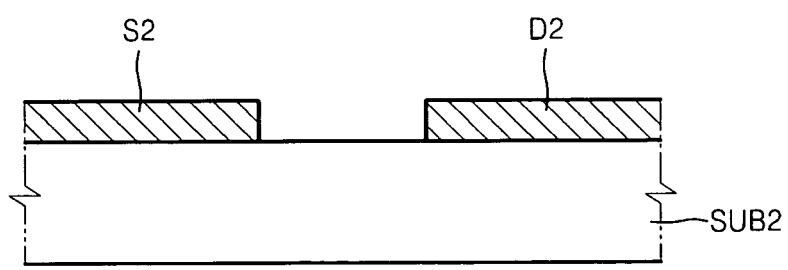
FIGS. 11A through 11D are cross-sectional views illustrating a method of manufacturing a transistor according to example embodiments.

Referring to FIG. 11A, a source electrode S2 and a drain electrode D2 may be formed on a substrate SUB2 separately from each other.

Figure 11B:
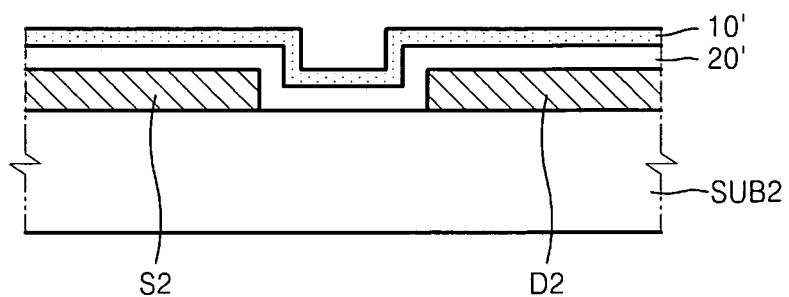

Referring to FIG. 11B, an oxide thin film for forming a channel, which has a multi-layer structure, may be formed on the substrate SUB2 to cover the source electrode S2 and the drain electrode D2. For example, a second oxide layer 20' and a first oxide layer 10' may be formed sequentially. The first and second oxide layers 10' and 20' may be the same as the first and second oxide layers 10 and 20 of FIG. 10B, respectively. Materials, thicknesses and methods of forming the first and second oxide layers 10' and 20' may be the same as those of the first and second oxide layers 10 and 20 of FIG. 10B.

Figure 11C:
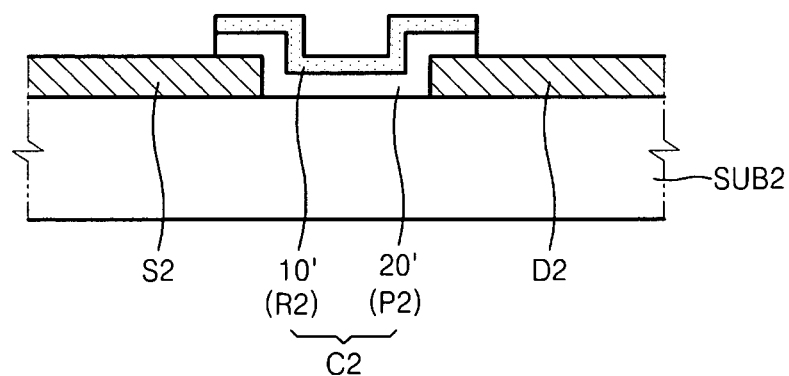

Referring to FIG. 11C, a channel layer C2 may be formed by patterning the first and second oxide layers 10' and 20'. The patterned first oxide layer 10' and the patterned second oxide layer 20' may be the same as the oxygen-rich layer R2 and the oxygen-poor layer P2 of FIG. 2, respectively. Hereinafter, the patterned first oxide layer 10' and the patterned second oxide layer 20' are referred to as the oxygen-rich layer R2 and the oxygen-poor layer P2, respectively.

Figure 11D:
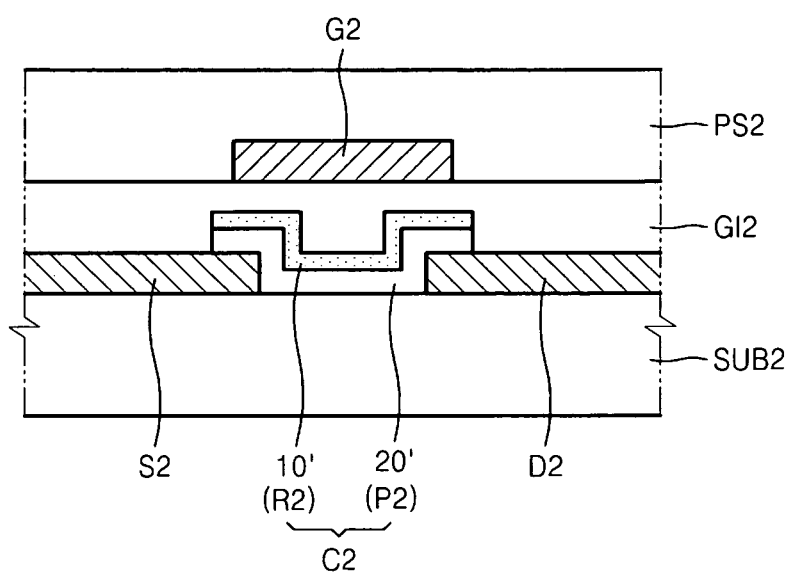

Referring to FIG. 11D, a gate insulating layer GI2 may be formed on the source electrode S2, the drain electrode D2 and the channel layer C2. The gate insulating layer GI2 may be the same as the gate insulating layer GI1 of FIG. 10A. A gate G2 may be formed on the gate insulating layer GI2. The gate G2 may be formed above the channel layer C2. The gate G2 may be formed of the same metal as, or a different metal from, the source and drain electrodes S2 and D2. A passivation layer PS2 may be formed on the gate insulating layer GI2 to cover the gate G2. The passivation layer PS2 may be formed to have a monolayer or multi-layer structure including at least one of a silicon oxide layer, a silicon nitride layer and an organic layer. The transistor described above may be annealed at a given temperature.

A transistor having the structure of the transistor of FIG. 4 may be obtained by modifying the method described above with reference to FIGS. 11A through 11D. In the operation described with reference to FIG. 11B, a first oxygen-poor oxide layer, an oxygen-rich oxide layer and a second oxygen-poor oxide layer are sequentially stacked and then patterned to obtain a structure of the channel layer C2' of FIG. 4. After subsequent operations, the transistor having the structure of the transistor of FIG. 4 may be obtained.

A transistor according to example embodiments may be used as a switching device, or a driving device, in flat panel display devices (e.g., liquid crystal display (LCD) devices and organic light emitting display (OLED) devices). As described above, the transistor according to example embodiments has small (or negligible) characteristic variations due to light, increasing the reliability of a flat panel display device including the transistor. The structures of LCD devices and OLED devices are well-known and thus detailed descriptions thereof will be omitted. The transistor according to example embodiments may be used for various purposes in other electronic devices (e.g., memory devices and logic devices), as well as, flat panel display devices.

It should be understood that example embodiments described herein should be considered in a descriptive sense only and not for purposes of limitation. For example, it will be understood by one of ordinary skill in the art that the components and the structures of the transistors illustrated in FIGS. 1 through 4 may be modified and changed. In detail, positions of the 'oxygen-rich layer' and the 'oxygen-poor layer' in the transistors of FIGS. 1 through 4 may be changed. Also, the transistor according to example embodiments may have a double-gate structure and the channel layers C1, C1', C2, and C2' may each have a multi-layer structure including at least four layers. Also, it will be understood by one of ordinary skill in the art that the method of FIGS. 10A through 10D and the method of FIGS. 11A through 11D may also be variously changed. Furthermore, example embodiments may also be applied to various transistors as well as oxide thin film transistors. Descriptions of features or aspects, within each embodiment should typically be considered as available for other similar features or aspects in other embodiments.

What is claimed is:

1. A transistor, comprising:
a channel layer having a multi-layer structure;
a source electrode and a drain electrode separately contacting opposing ends of the channel layer;
a gate corresponding to the channel layer; and
a gate insulating layer between the channel layer and the gate,
wherein the channel layer includes a first layer, a second layer and a third layer that are sequentially disposed on a same side of the gate, each of the first layer, the second layer and the third layer includes a ZnO-based oxide semiconductor, the first layer is between the gate and the second layer, the second layer is between the gate and the third layer, and the third layer is a continuous layer from the source electrode to the drain electrode,
an oxygen concentration of the second layer is higher than an oxygen concentration of the first and third layers, a ratio of a concentration of all metal elements of the second layer with respect to the oxygen concentration thereof is lower than a ratio of a concentration of all metal elements of the first or third layer with respect to the oxygen concentration thereof,
a carrier density of the first and third layers is greater than a carrier density of the second layer,
a first portion of the third layer is between the source electrode and the second layer, a top surface of the first portion directly contacts the source electrode, a second portion of the third layer is between the drain electrode and the second layer, a top surface of the second portion directly contacts the drain electrode, a third portion of the third layer is between the first portion and the second portion, and each of the first portion, the second portion and the third portion has an oxygen concentration lower than the oxygen concentration of the second layer,
the channel layer has the multi-layer structure including the first layer, the second layer and the third layer in a region including a first region between the source electrode and the drain electrode, the first region is not overlapped with the source electrode and the drain electrode.

2. The transistor of claim 1, wherein the oxygen concentration of the second layer is about 50 at % to about 90 at %.

3. The transistor of claim 1, wherein the oxygen concentration of at least one of the first and third layers is about 40 at % to about 50 at %.

4. The transistor of claim 1, wherein the ZnO-based oxide semiconductor includes at least one element selected from the group consisting of indium (In), gallium (Ga), tin (Sn), titanium (Ti), zirconium (Zr), hafnium (Hf), yttrium (Y), tantalum (Ta) and chromium (Cr).

5. The transistor of claim 1, wherein the first layer has a thickness of about 2-nm to about 30-nm.

6. The transistor of claim 1, wherein the second layer has a thickness of about 2-nm to about 30-nm.

7. The transistor of claim 1, wherein the third layer has a thickness of about 30-nm to about 100-nm.

8. The transistor of claim 1, wherein the gate is under the channel layer, and the source electrode and the drain electrode contact an upper surface of the channel layer.

9. The transistor of claim 1, wherein the first layer contacts the gate insulating layer.

10. A flat panel display device, comprising the transistor according to claim 1.

11. A transistor, comprising:
a channel layer having a multi-layer structure;
a source electrode and a drain electrode separately contacting opposing ends of the channel layer;
a gate corresponding to the channel layer; and
a gate insulating layer between the channel layer and the gate,
wherein the channel layer includes a first layer, a second layer and a third layer that are sequentially disposed on a same side of the gate, the first layer is between the gate and the second layer, and the second layer is between the gate and the third layer,
each of the first, second and third layers includes a ZnO-based oxide semiconductor, and the third layer is a continuous layer from the source electrode to the drain electrode,
a ratio of a concentration of all metal elements of the second layer with respect to the oxygen concentration thereof is lower than a ratio of a concentration of all metal elements of the first or third layer with respect to the oxygen concentration thereof,
a carrier density of the first and third layers is greater than a carrier density of the second layer,
a first portion of the third layer is between the source electrode and the second layer, a top surface of the first portion directly contacts the source electrode, a second portion of the third layer is between the drain electrode and the second layer, a top surface of the second portion directly contacts the drain electrode, a third portion of the third layer is between the first portion and the second portion, and each of the first portion, the second portion and the third portion has an oxygen concentration lower than the oxygen concentration of the second layer,
the channel layer has the multi-layer structure including the first layer, the second layer and the third layer in a region including a first region between the source electrode and the drain electrode, the first region is not overlapped with the source electrode and the drain electrode.

12. The transistor of claim 11, wherein the first layer contacts the gate insulating layer.

13. A transistor, comprising:
a channel layer having a multi-layer structure;
a source electrode and a drain electrode separately contacting opposing ends of the channel layer;
a gate corresponding to the channel layer; and
a gate insulating layer between the channel layer and the gate,
wherein the channel layer includes a first layer, a second layer and a third layer that are sequentially disposed on a same side of the gate, each of the first layer, the second layer and the third layer includes a ZnO-based oxide semiconductor, the first layer is between the gate and the second layer, the second layer is between the gate and the third layer, and the third layer is a continuous layer from the source electrode to the drain electrode,
an oxygen concentration of the second layer is higher than an oxygen concentration of the first and third layers, the oxygen concentration of the second layer is greater than 50 at % and smaller than 90 at %, and the oxygen concentration of at least one of the first and third layers is greater than 40 at % and smaller than 50 at %,
a ratio of a concentration of all metal elements of the second layer with respect to the oxygen concentration thereof is lower than a ratio of a concentration of all metal elements of the first or third layer with respect to the oxygen concentration thereof,
a carrier density of the first and third layers is greater than a carrier density of the second layer,
a thickness of the third layer is greater than a thickness of the second layer,
a first portion of the third layer is between the source electrode and the second layer, a top surface of the first portion directly contacts the source electrode, a second portion of the third layer is between the drain electrode and the second layer, a top surface of the second portion directly contacts the drain electrode, a third portion of the third layer is between the first portion and the second portion, and each of the first portion, the second portion and the third portion has an oxygen concentration lower than the oxygen concentration of the second layer,
the channel layer has the multi-layer structure including the first layer, the second layer and the third layer in a region including a first region between the source electrode and the drain electrode, the first region is not overlapped with the source electrode and the drain electrode.

14. The transistor of claim 13, wherein the thickness of the third layer is greater than a thickness of the first layer.

* * * * *